(12) United States Patent
Sakata et al.

(10) Patent No.: US 8,044,572 B2
(45) Date of Patent: Oct. 25, 2011

(54) LIGHT CONVERSION STRUCTURE AND LIGHT-EMITTING DEVICE USING THE SAME

(75) Inventors: Shin-ichi Sakata, Ube (JP); Atsuyuki Mitani, Ube (JP); Itsuhiro Fujii, Ube (JP)

(73) Assignee: Ube Industries, Ltd. (JP)

( * ) Notice: Subject to any disclaimer, the term of this patent is extended or adjusted under 35 U.S.C. 154(b) by 330 days.

(21) Appl. No.: 11/792,899

(22) PCT Filed: Dec. 13, 2005

(86) PCT No.: PCT/JP2005/023199
§ 371 (c)(1),
(2), (4) Date: Jun. 11, 2007

(87) PCT Pub. No.: WO2006/064930
PCT Pub. Date: Jun. 22, 2006

(65) Prior Publication Data
US 2007/0257597 A1      Nov. 8, 2007

(30) Foreign Application Priority Data

Dec. 17, 2004      (JP) .................................. 2004-365589

(51) Int. Cl.
*H01J 1/62* (2006.01)
*H01J 63/04* (2006.01)
(52) U.S. Cl. ........ 313/503; 313/498; 313/501; 313/502; 313/485; 313/486; 313/487; 313/467; 313/468
(58) Field of Classification Search .......... 313/484–487, 313/498–503, 467, 468; 257/79–103
See application file for complete search history.

(56) References Cited

U.S. PATENT DOCUMENTS 5,998,925 A      12/1999   Shimizu et al.
2002/0106446 A1 *  8/2002   Satoh .............................. 427/66
(Continued)

FOREIGN PATENT DOCUMENTS

| EP | 0 816 537 A2 | 1/1998 |
| EP | 1 480 278 A2 | 11/2004 |
| WO | WO 2004065324 A1 * | 8/2004 |

OTHER PUBLICATIONS

H.A. Hoppe et al., "Luminescence in $Eu^{2+}$-doped $Ba_2Si_5N_8$: fluorescence, thernoliminescence, and upconversion"; Journal of Physics and Chemistry of Solids 61 (2000) pp. 2001-2006.

(Continued)

*Primary Examiner* — Nimeshkumar Patel
*Assistant Examiner* — Thomas A Hollweg
(74) *Attorney, Agent, or Firm* — DLA Piper LLP (US)

(57) ABSTRACT

A light conversion structure ensuring good light transmission and less deterioration and capable of controlling light to a desired color tone and emitting a highly bright light, and a light-emitting device using the same. The light conversion structure is a light conversion structure including a layer formed of a ceramic composite, which absorbs a part of a first light to emit a second light and transmits a part of the first light, and a fluorescent layer for the control of color tone, which is formed on the surface of the ceramic composite and which absorbs a part of the first light or a part of the second light to emit a third light and transmits a part of the first light or a part of the second light, wherein the ceramic composite includes a solidified body where at least two or more metal oxide phases are formed continuously and three-dimensionally entangled with each other, and at least one metal oxide phase in the solidified body includes a metal element oxide capable of emitting fluorescence.

2 Claims, 3 Drawing Sheets

U.S. PATENT DOCUMENTS

| | | |
|---|---|---|
| 2003/0080341 A1 | 5/2003 | Sakano et al. |
| 2004/0145308 A1 | 7/2004 | Rossner et al. |
| 2005/0189863 A1* | 9/2005 | Nagatomi et al. ............ 313/486 |
| 2005/0212397 A1* | 9/2005 | Murazaki et al. ............ 313/487 |
| 2006/0124951 A1* | 6/2006 | Sakata et al. .................... 257/99 |

OTHER PUBLICATIONS

Dai 65-Kai Ovo Butsuri Gakkai Gakujutsu Koen Kai, Koen Yokoh Shu (65rh Lecture Presentation by JSAP, preprints), p. 1283, 2004.

* cited by examiner

LIGHT CONVERSION STRUCTURE AND LIGHT-EMITTING DEVICE USING THE SAME

CROSS-REFERENCE TO RELATED APPLICATIONS

This application is a §371 of International Application No. PCT/JP2005/023199, with an international filing date of Dec. 13, 2005 (WO 2006/064930 A1, published Jun. 22, 2006), which is based upon and claims the benefit of priority from Japanese Patent Application No. 2004-365589, filed on Dec. 17, 2004, the entire contents of which are incorporated herein by reference.

TECHNICAL FIELD

This disclosure relates to a light conversion structure capable of converting a part of irradiation light into light at a wavelength different from that of the irradiation light and at the same time, mixing the converted light with the unconverted irradiation light to cause conversion to light having a color different from that of the irradiation light, and a high-brightness light-emitting device using the structure.

BACKGROUND

With the recent implementation into practice of a blue light-emitting diode, studies are being aggressively made to develop a white light-emitting diode using the blue diode as the light emission source. The white light-emitting diode is lightweight, uses no mercury and has long life, and therefore demand is expected to rapidly expand in the future. As for the white light-emitting diode, a diode obtained by coating a blue light-emitting element with a mixture of cerium-activated YAG ($Y_3Al_5O_{12}$:Ce) powder and epoxy resin is usually employed (see, Japanese Unexamined Patent Publication (Kokai) No. 2000-208815).

However, a highly bright light-emitting device cannot be obtained using a mixture of cerium-activated $Y_3Al_5O_{12}$ (YAG:Ce) powder and epoxy resin, because the light is absorbed by the surface defect of the fluorescent powder. Particularly, the above-described effect increases in a layer comprising an epoxy having dispersed therein a fluorescent substance, because complicated reflection and transmission are repeated on the fluorescent powder surface. Also, the refractive index of the fluorescent substance is larger than resin, and therefore the total reflection occurs inside the fluorescent substance every time light passes through the fluorescent substance, and as a result, a large absorption of light is occurs. For these reasons, a highly bright light-emitting diode cannot be obtained for a white light-emitting diode which has a construction in which a fluorescent substance is dispersed in a resin.

Furthermore, the color of YAG:Ce fluorescence is approximately x=0.41 and y=0.56 in the CIE chromaticity coordinates and when mixed with the blue excitation light at 460 nm, since the color tone is controlled on a line connecting the chromatic coordinate of blue light-emitting diode and the chromatic coordinate of YAG:Ce, the color produced is not white, but becomes white mixed with a blue green-color, so that only a white color insufficient in the red component can be realized. In order to solve this problem, another fluorescent powder capable of emitting a red fluorescence is mixed with the YAG:Ce fluorescent powder and this powder mixture is mixed with the resin, thereby adjusting the color tone. In this way, controlling the color tone of a light-emitting diode, a method of mixing a second fluorescent powder, kneading the mixture with a resin, and coating the kneaded product on a light-emitting element to obtain a color tone that was formerly unachievable is being widely employed.

As described above, in conventional light-emitting diodes, a white light-emitting diode that assures a highly bright light after a change in color tone has not been obtained. In addition, there is a problem in that deterioration occurs due to use of an organic material, such as resin at a portion close to the light source.

It could therefore be advantageous to provide a light conversion structure ensuring good light transmission, high brightness and less deterioration, and capable of controlling the light to a desired color tone. It could also be advantageous to provide a light-emitting device, such as light-emitting diode, using the light conversion structure.

SUMMARY

We have taken note of a light conversion material comprising a solidified body where two or more metal oxide phases are formed in a state of being continuously and three-dimensionally entangled with each other, and having excellent properties such as good light transmission and less deterioration. And as a result of intensive studies on a method capable of controlling the color tone while ensuring these properties, our light conversion structure has been accomplished.

That is, we provide a light conversion structure comprising a layer formed of a ceramic composite, which absorbs a part of a first light to emit a second light and transmits a part of the first light, and a fluorescent layer for the control of color tone, which is formed on the surface of the ceramic composite and which absorbs a part of the first light or a part of the second light to emit a third light and transmits a part of the first light or a part of the second light, wherein the ceramic composite comprises a solidified body where at least two or more metal oxide phases are formed continuously and three-dimensionally entangled with each other, and at least one metal oxide phase in the solidified body comprises a metal element oxide capable of emitting fluorescence.

We also provide a light conversion structure, wherein the solidified body comprises two metal oxide phases of $\alpha$-$Al_2O_3$ phase and cerium-activated $Y_3Al_5O_{12}$ (YAG) phase.

We further provide a light conversion structure, wherein the solidified body comprises two metal oxide phases of $\alpha$-$Al_2O_3$ phase and terbium-activated $Y_3Al_5O_{12}$ (YAG) phase.

We still further provide light conversion structure, wherein the first light is a light having a peak at 200 to 500 nm, the second light is a light having a peak at a wavelength of 510 to 650 nm, and the third light is a light having a peak at 550 to 700 nm.

In one aspect, the fluorescent layer for the control of color tone is preferably a layer where at least one fluorescent substance selected from the group consisting of $CaAlSiN_3$:Eu, $BaMgAl_{10}O_{17}$:Eu and $Ca_2Si_5N_8$:Eu is dispersed in a silicone layer.

Also, in one aspect, the fluorescent layer for the control of color tone is preferably a layer comprising a solidified body where a $Y_3Al_5O_{12}$ (YAG) phase and a Cr-added $\alpha$-$Al_2O_3$ phase are formed continuously and three-dimensionally entangled with each other.

Furthermore, we provide a light-emitting device comprising a light-emitting element capable of emitting the first light and the above-described light conversion structure disposed to receive the first light of the light-emitting element.

DETAILED DESCRIPTION

Figure 1:
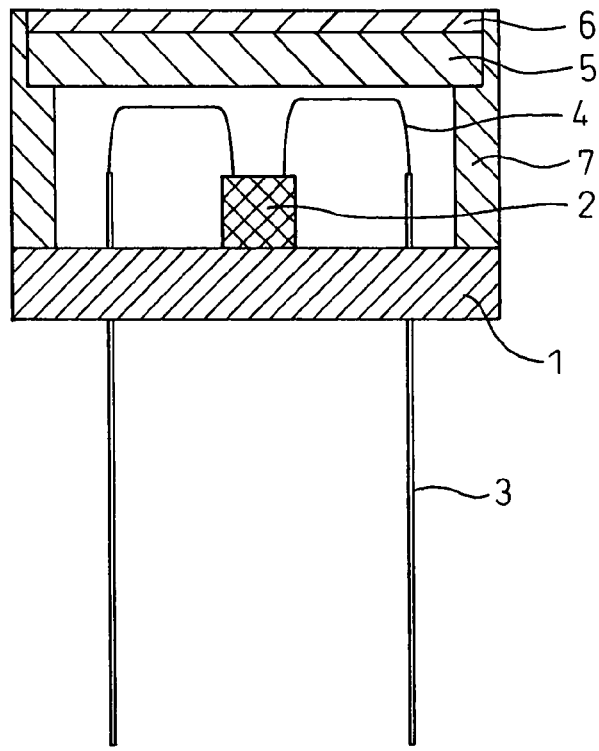
FIG. 1 is a cross-sectional view showing one example of a light conversion structure and the light-emitting device.

The light conversion structure and light-emitting device are described by referring to the drawings. FIG. 1 is a view showing one aspect of the light conversion structure and the light-emitting device using the structure. As shown in FIG. 1, the light-emitting device comprises a light-emitting element capable of emitting light, which works as an excitation source, and the light conversion structure, which is disposed to receive the light of the light-emitting element. Examples of the light-emitting element include a light-emitting diode, a laser and a mercury lamp. When a light-emitting diode is used as the light-emitting element, the light-emitting device is referred to as a light-emitting diode.

In the light-emitting device of FIG. 1, a light-emitting element 2 is fixed on a metal-made supporting stand 1. The electrode on the element is connected to an electrode 3 of the supporting stand through an electrically conducting wire 4. The supporting stand is topped with a ceramic composite 5, and a fluorescent layer 6 for the control of color tone is formed on the surface of the ceramic composite. The first light (for example, blue light) outgoing from the light-emitting element 2 is partially converted into a second light (for example, yellow) by the ceramic composite 5 and partially transmitted, and these lights are mixed and come out. The first and second lights coming out from the ceramic composite 5 enter the fluorescent layer 6 for the control of color tone. The fluorescent layer for the control of color tone absorbs a part of the light (for example, yellow or blue light) contained in white and adds a third light of a new color (for example, red light), and a light which is as a whole, a mixture of these lights coming from the light conversion structure. In this way, emission color can be controlled.

The light conversion structure comprises a layer formed of a ceramic composite, which absorbs a part of a first light to emit a second light and transmits a part of the first light, and a fluorescent layer for the control of color tone, which is formed on the surface of the ceramic composite and which absorbs a part of the first light or a part of the second light to emit a third light and transmits a part of the first light or a part of the second light.

The ceramic composite comprises a solidified body where at least two or more metal oxide phases are formed continuously and three-dimensionally entangled with each other, and at least one metal oxide phase in the solidified body comprises a metal element oxide capable of emitting fluorescence.

A solidified body where at least two or more metal oxide phases are formed continuously and three-dimensionally entangled with each other is used, whereby high transmittance of converted light and unconverted light is ensured in order to obtain a highly bright light and at the same time, a light-emitting diode and a light-emitting device each assured of good mixing of light colors and less deterioration.

The fluorescent layer for the control of color tone is a layer containing a fluorescent substance, which absorbs a part of the first light or a part of the second light to emit a third light, and having a phase which transmits a part of the first light or a part of the second light. A fluorescent layer for the control of color tone, which absorbs a part of the first light or a part of the second light to emit a third light and transmits a part of the first light or a part of the second light, is provided on the surface of the ceramic composite, whereby color tone can be easily controlled.

Regarding the light-transmitting element, a commercially available light-transmitting diode element can be used. The light source is not limited to a light-emitting diode, and the same effect can also be obtained with a light source such as ultraviolet lamp or laser. As for the wavelength of the light source, a wavelength in the range from ultraviolet to blue may be used. When a wavelength of 200 to 500 nm is used, the ceramic composite can exhibit high emission intensity and this is preferred.

The electrically conducting wire preferably has a size of 10 to 45 μm in view of working with a wire bonder, and examples of the construction material include gold, copper, aluminum, platinum and an alloy thereof. Examples of the electrode attached to a side surface of the light conversion ceramic composite of the supporting stand include an electrode of iron, copper, gold, iron-containing copper, tin-containing copper, or silver-plated aluminum, iron or copper.

The ceramic composite constituting the light conversion structure of the present invention comprises a solidified body where at least two or more metal oxide phases are formed continuously and three-dimensionally entangled with each other, and at least one metal oxide phase in the solidified body contains a metal element oxide capable of emitting fluorescence. The metal oxide phase constituting the solidified body is preferably selected from a single metal oxide and a complex metal oxide.

The single metal oxide is an oxide of one kind of metal, and the complex metal oxide is an oxide of two or more kinds of metals. Each oxide has a three-dimensionally mutually entangled structure. Examples of the single metal oxide include aluminum oxide ($Al_2O_3$), zirconium oxide ($ZrO_2$), magnesium oxide (MgO), silicon oxide ($SiO_2$), titanium oxide ($TiO_2$), barium oxide (BaO), beryllium oxide (BeO), calcium oxide (CaO), chromium oxide ($Cr_2O_3$) and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$ and $Lu_2O_3$).

Examples of the complex metal oxide include $LaAlO_3$, $CeAlO_3$, $PrAlO_3$, $NdAlO_3$, $SmAlO_3$, $EuAlO_3$, $GdAlO_3$, $DyAlO_3$, $ErAlO_3$, $Yb_4Al_2O_9$, $Y_3Al_5O_{12}$, $Er_3Al_5O_{12}$, $Tb_3Al_5O_{12}$, $11Al_2O_3 \cdot La_2O_3$, $11Al_2O_3 \cdot Nd_2O_3$, $3Dy_2O_3 \cdot 5Al_2O_3$, $2Dy_2O_3 \cdot Al_2O_3$, $11Al_2O_3 \cdot Pr_2O_3$, $EuAl_{11}O_{18}$, $2Gd_2O_3 \cdot Al_2O_3$, $11Al_2O_3 \cdot Sm_2O_3$, $Yb_3Al_5O_{12}$, $CeAl_{11}O_{18}$ and $Er_4Al_2O_9$.

In the case of constituting a white light-emitting diode, the ceramic composite is preferably a combination of an $Al_2O_3$ crystal and a garnet crystal-type single crystal, which is a complex metal oxide activated with a rare earth element. This light conversion element absorbs a part of the light emitted from InGaN typically constituting a nitride semiconductor layer which emits a visible light, and a white light-emitting diode can be efficiently obtained. The garnet-type crystal is represented by the structural formula: $A_3X_5O_{12}$, and it is preferred in the structural formula that A contains one or more elements selected from the group consisting of Y, Tb, Sm, Gd, La and Er, and X contains one or more elements selected from Al and Ga. The light conversion material comprising this particularly preferred combination is preferably combined with Ce-activated $Y_3Al_5O_{12}$, which absorbs a part of ultraviolet-to-blue light while transmitting light and emits yellow fluorescence, because the Ce-activated $Y_3Al_5O_{12}$ emits an intense yellow light at 510 to 650 nm by the effect of an excitation light having a peak at 200 to 500 nm. Furthermore, when combined with Tb-activated $Y_3Al_5O_{12}$, an intense green light is emitted in the above-described excitation wavelength region, and this is also preferred.

The ceramic composite constituting the light conversion structure is formed by melting raw metal oxides and solidifying the melt. The solidified body may be obtained, for example, by a simple and easy method where melt charged into a crucible kept at a predetermined temperature is cooled and solidified while controlling the cooling temperature. A solidified body produced by a unidirectional solidification method is preferred. Regarding the ceramic composite material, various combinations of crystal phases may be considered, but the embodiment is described below by referring to an $Al_2O_3/Y_3Al_5O_{12}$:Ce system, which is the most important compositional system in view of constituting a white light-emitting diode. The outline of the process of unidirectional solidification is as follows.

$\alpha$-$Al_2O_3$, $Y_2O_3$ and $CeO_2$ are mixed at a desired ratio of components to prepare a mixed powder. In the case of mixing only $\alpha$-$Al_2O_3$ and $Y_2O_3$, the optimal compositional ratio is 82:18 in terms of the molar ratio. In the case of adding $CeO_2$, the ratio of components $Al_2O_3$, $Y_2O_3$ and $CeO_2$ is determined by the reverse calculation from the Ce substitution amount based on the finally produced YAG. The mixing method is not particularly limited and either a dry mixing method or a wet mixing method may be employed. Subsequently, the mixed powder is heated and melted at a temperature of causing the charged raw materials to melt by using a known melting furnace such as arc melting furnace. For example, in the case of $Al_2O_3$ and $Y_2O_3$, the mixed powder is heated and melted at 1,900 to 2,000° C.

The obtained melt is directly charged into a crucible and subjected to unidirectional solidification. Alternatively, the melt is once solidified and then ground, the ground product is charged into a crucible and again heated and melted, and the crucible containing the melt is withdrawn from the heating zone of the melting furnace and subjected to unidirectional solidification. The unidirectional solidification of the melt may be performed under atmospheric pressure but for obtaining a material with less defects of the crystal phase, the unidirectional solidification is preferably performed under a pressure of 4,000 Pa or less, more preferably 0.13 Pa ($10^{-3}$ Torr) or less.

The withdrawing rate of the crucible from the heating zone, that is, the solidification rate of the melt, is set to an appropriate value according to the melt composition and melting conditions but is usually 50 mm/hour or less, preferably from 1 to 20 mm/hour.

Regarding the apparatus used for the unidirectional solidification, a known apparatus may be used, where a crucible is vertically movably housed in a cylindrical container disposed in the vertical direction, an induction coil for heating is fixed to the central outer side of the cylindrical container, and a vacuum pump for depressurizing the space in the container is disposed.

The fluorescent substance constituting at least one phase of the ceramic composite for light conversion can be obtained by adding an activation element to a metal oxide or a complex oxide. The ceramic composite for light conversion uses at least one constituent phase as a fluorescent phase, but the ceramic composite material used may be fundamentally the same as the ceramic composite material previously disclosed by the applicant (assignee) in, for example, Japanese Unexamined Patent Publication (Kokai) Nos. 7-149597, 7-187893, 8-81257, 8-253389, 8-253390 and 9-67194 and their corresponding U.S. patent applications (U.S. Pat. Nos. 5,569,547, 5,484,752 and 5,902,763) and can be produced by the production methods disclosed in these applications (patents). The contents disclosed in these applications or patents are incorporated herein by way of reference.

A shaped article having a necessary shape such as block, plate or disc is cut out from the solidified body and used as a ceramic composite material substrate for converting a light at a certain wavelength into a light having an objective different color hue.

In the case of obtaining a white light-emitting diode, it is preferred that the first light is a light having a peak at an ultraviolet wavelength of 200 to 500 nm, the second light is a light having a peak at a wavelength of 510 to 650 nm, and the third light is a light having a peak at 550 to 700 nm. By virtue of a combination with a ceramic composite comprising a solidified body composed of two metal oxide phases of $\alpha$-$Al_2O_3$ phase and cerium- or terbium-activated $Y_3Al_5O_{12}$ (YAG) phase, a warm white color that is highly bright with less deterioration can be obtained.

One aspect of the fluorescent layer for the control of color tone is a layer where a fluorescent powder is dispersed in a transparent resin. Since the light conversion material is a solid matter, a second fluorescent film can be formed on a smooth surface, and various methods can be employed for the film formation. For example, a silicone resin having dispersed therein a florescent powder may be coated. As for the coating method, a dipping method, a screen printing method, a spraying method and the like may also be employed. Without using a silicone resin, a film formation technique such as vapor deposition, CVD and sputtering may also be utilized. As for the film shape, the light emitted can be controlled by forming the film in various shapes such as lattice, stripe or dot, in addition to control to a uniform thickness.

Regarding the fluorescent substance for the control of color tone, various existing fluorescent substances can be used. For example, in the case of adding a red color, an inorganic fluorescent substance may be used, and examples thereof include known fluorescent substances such as Eu-activated $Ba_2Si_5N_8$ disclosed in Journal of Physics and Chemistry of Solids, 61, pp. 2001-2006 (2000), Eu-activated $Ca_2Si_5N_8$ and $(Ca,Sr)_2Si_5N_8$ disclosed in Kokai No. 2003-27746, and Eu-activated $CaAlSiN_3$ disclosed in Dai 65-Kai Oyo Butsuri Gakkai Gakujutsu Koen Kai, Koen Yokoh Shu (65th Lecture Presentation by JSAP, preprints), page 1283. These fluorescent substances can emit an intense red light at 550 to 700 nm for the excitation at 300 to 500 nm and therefore, when used in combination with a ceramic composite material, a white color tinted with red can be obtained using the light emitted as a first light. An organic coloring matter may also be used, for example, fluorescein. In this case, red can be added to white by using a part of the light emitted from the ceramic composite material, and a warm white color can be obtained. As for the blue fluorescent substance, Eu-containing $BaMgAl_{10}O_{17}$ (BAM:Eu) and the like may be used.

The fluorescent layer for the control of color tone is preferably a layer where at least one fluorescent substance selected from the group consisting of $CaAlSiN_3$:Eu, $BaMgAl_{10}O_{17}$:Eu and $Ca_2Si_5N_8$:Eu is dispersed in a silicone resin. The layer where such a fluorescent substance is dispersed in a silicone resin appropriately emits a red light and at the same time, efficiently transmits the unabsorbed light, so that the light can be controlled to a desired color and a high-bright-ness light-emitting diode can be provided.

Another aspect of the fluorescent layer for the control of color tone is a layer comprising a solidified body where two or more metal oxide phases are formed in the state of being continuously and three-dimensionally entangled with each other and at least one metal oxide phase in the solidified body is a metal element oxide capable of emitting fluorescence. More specifically, a layer comprising a solidified body where a $Y_3Al_5O_{12}$ (YAG) phase and a Cr-added $\alpha$-$Al_2O_3$ phase are formed being continuously and three-dimensionally entangled with each other is preferred. By virtue of using a solidified body where a $Y_3Al_5O_{12}$ (YAG) phase and a Cr-added $\alpha$-$Al_2O_3$ phase are formed continuously and three-dimensionally entangled with each other, how-ever not only can the light be controlled to a desired color, but also a highly bright light-emitting diode free of deterioration and assured of high heat resistance and good mixing of light colors can be obtained.

Incidentally, the fluorescent layer for the control of color tone is used for changing the color tone and therefore, the thickness thereof does not need to be as large as the thickness of the ceramic composite, so that excellent properties such as high brightness, less deterioration and good mixing of light colors, which are properties of the ceramic composite, can be maintained.

The layer comprising a solidified body where a $Y_3Al_5O_{12}$ (YAG) phase and a Cr-added $\alpha$-$Al_2O_3$ phase are formed continuously and three-dimensionally entangled with each other can be produced by the same method as that for the ceramic composite. The method of forming the fluorescent layer for the control of color tone, comprising such a solidified body, on the surface of the layer comprising the ceramic composite is not particularly limited, and examples thereof include a method of merely stacking and fixing these layers, and a method of bonding these layers with a light-transparent adhesive. The wording "forming the fluorescent layer for the control of color tone on the surface of the layer comprising the ceramic composite" is not limited, for example, to further successively grow another layer on the surface of the layer comprising the ceramic composite, and it may be sufficient if those two layers are in the state of being tightly stacked.

EXAMPLES

The light conversion structure and light-emitting device are described in greater detail below by referring to specific examples.

Example 1

0.8136 Mol of an $\alpha$-$Al_2O_3$ powder (purity: 99.99%), 0.1756 mol of a $Y_2O_3$ powder (purity: 99.999%) and 0.0109 mol of a $CeO_2$ powder (purity: 99.99%) were used as raw materials. These powders were wet-mixed in ethanol by a ball mill for 16 hours, and the ethanol was then removed using an evaporator to obtain a raw material powder. This raw material powder was preliminarily melted in a vacuum furnace and used as a raw material for unidirectional solidification.

Subsequently, the obtained raw material was directly charged into a molybdenum crucible and after setting the crucible in a unidirectional solidification apparatus, the powder was melted under a pressure of $1.33 \times 10^{-3}$ Pa ($10^{-5}$ Torr). In the same atmosphere, the crucible was moved down at a speed of 5 mm/hour, thereby obtaining a solidified body. This solidified body displayed a yellow color. As a result of observation through an electron microscope, this solidified body was found to be free from a colony or a grain boundary phase and have a uniform texture not allowing for the presence of an air bubble or a void. In the ingot, $CeAl_{11}O_{18}$ was observed, but the abundance thereof was very small.

Figure 2:
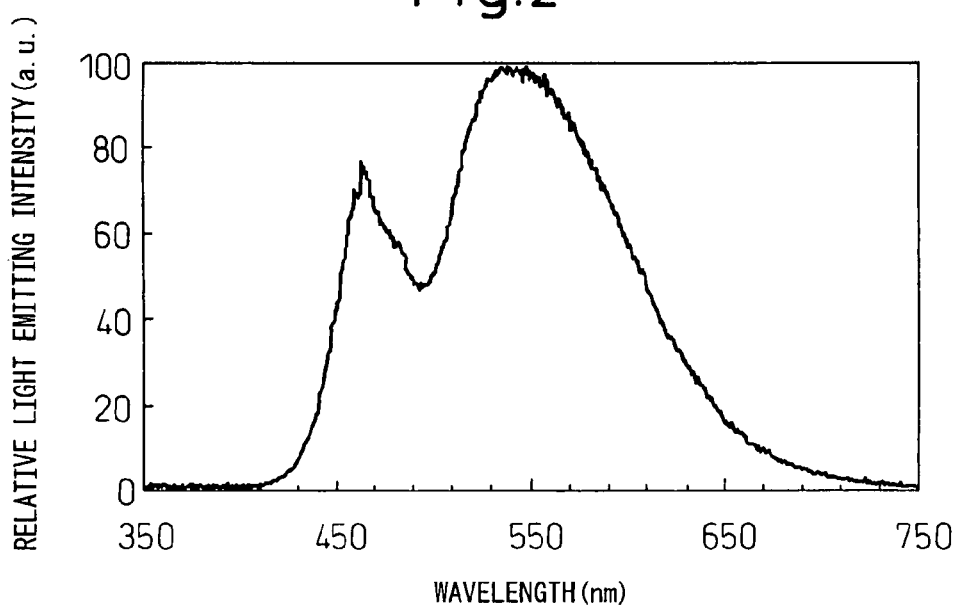
FIG. 2 is a view showing the spectrum of light obtained from the ceramic composite of Example 1.

A small disc-like piece having a diameter of 1.5 mm and a thickness of 0.1 mm was cut out from the solidified body of the ceramic composite material for light conversion. Subsequently, a light-emitting element of 460 nm was bonded to a ceramic package with electrodes by using a silver paste, and the electrode of the supporting stand and the electrode formed on the light-emitting element surface are joined with an electrically conducting wire by using a wire bonder. The ceramic composite produced above and the package were joined to produce a light-emitting diode without a fluorescent layer for the control of color tone. FIG. 2 shows the light emission spectrum obtained from the ceramic composite without a fluorescent layer for the control of color tone. At this time, the chromaticity coordinate was x=0.31 and y=0.34, revealing that the light was white slightly tinted with blue. In the measurement, an integrating sphere, FOIS-1, manufactured by Ocean Optics Inc. and a spectrometer, USB2000, manufactured by the same company were used. The integrating sphere and the spectrometer were connected by an optical fiber. This measurement system was calibrated using a NIST-compliant tungsten halogen standard light source.

Figure 3:
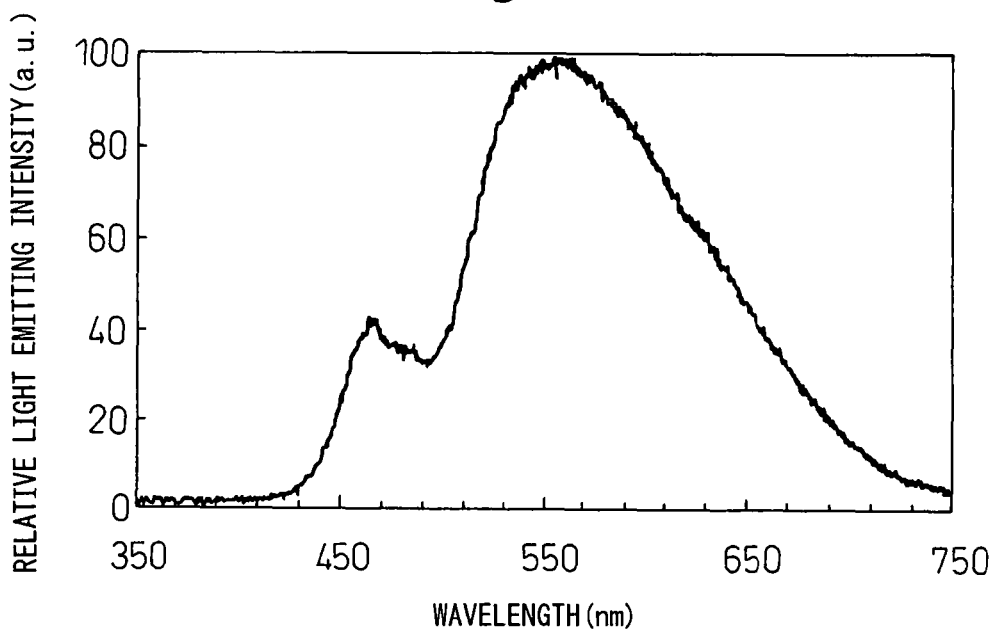
FIG. 3 is a view showing the light spectrum of the light-emitting diode obtained in Example 1.

Thereafter, $CaAlSiN_3$:$Eu^{2+}$ was prepared as a red fluorescent substance. As for the production method, $Ca_3N_2$, crystalline $Si_3N_4$, AlN and EuN were weighed and mixed in a nitrogen atmosphere. The mixed powder obtained was charged into a BN-made crucible and kept at 1,700° C. for 5 hours in a nitrogen atmosphere, thereby producing the fluorescent substance. The obtained powder was identified by X-ray diffraction and found to be $CaAlSiN_3$ and when ultraviolet and blue light were irradiated, red fluorescence attributable to $Eu^{2+}$ was observed. This red-type fluorescent substance was dispersed in a silicone resin to prepare an ink, and the ink was uniformly coated by a spin coater on the surface of the ceramic composite material for light conversion of the light-emitting diode produced above. FIG. 3 shows the light emission spectrum of the thus-produced light-emitting diode, in which the spectrum of red in the vicinity of 650 nm is increased. At this time, the chromaticity coordinate was x=0.40 and y=0.39. This coordinate does not follow the locus of the chromaticity coordinates of blue light-emitting diode and YAG:Ce and is positioned on the red color side, revealing that the control of color tone was effectively achieved. This diode was a white light-emitting diode capable of emitting a red-enhanced white light with a warm color tone.

Example 2

Figure 4:
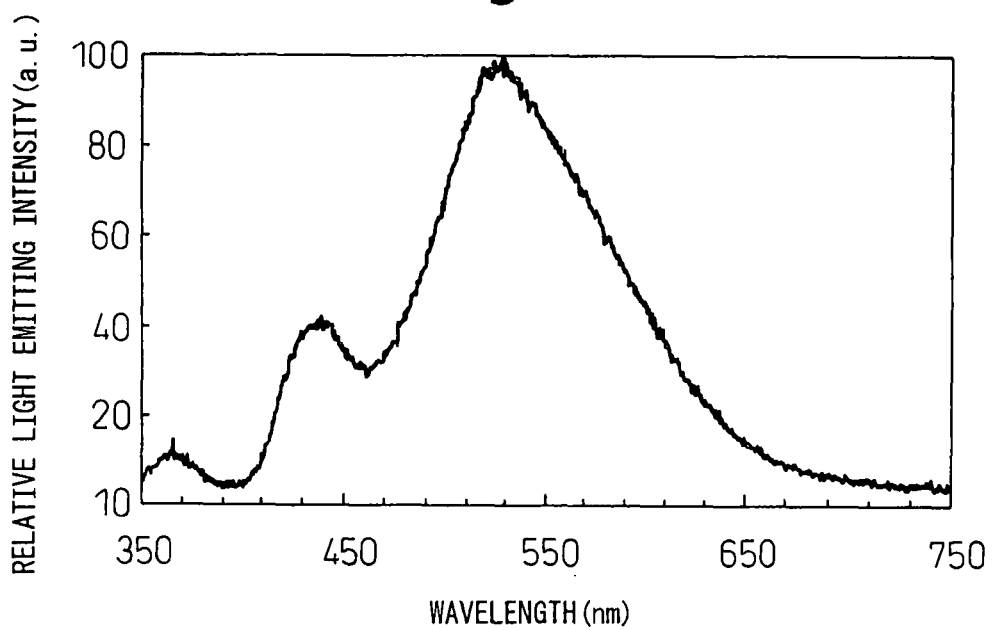
FIG. 4 is a view showing the light spectrum of the light-emitting diode obtained in Example 2.

A disc-like pellet having a diameter of 5 mm and a thickness of 0.2 mm was prepared from the solidified body of the ceramic composite material for light conversion produced in Example 1. This pellet emitted an intense yellow light when irradiated with ultraviolet light (365 nm). Subsequently, the same paste as that in Example 1 was produced using an Eu-containing $BaMgAl_{10}O_{17}$ (BAM:Eu) capable of absorbing ultraviolet light (365 nm) and emitting blue light, and coated on the light conversion material by a spin coater to form a uniform film. The spectrum of the light emitted from the surface coated with BAM:Eu was measured by irradiating ultraviolet light (365 nm) from the ceramic composite surface of this light conversion structure. FIG. 4 shows the results. A part of the ultraviolet light passed through the ceramic composite material for light conversion was changed to a blue light by the BAM:Eu and in combination with the yellow light emitted from the ceramic composite material for light conversion, a white light could be obtained. At this time, the chromaticity coordinate was x=0.29 and y=0.33. By using ultraviolet light and combining the BAM fluorescent substance with the light conversion material, the color tone of the ceramic composite material for light conversion could be controlled and a preferred white light could be obtained.

Example 3

Figure 5:
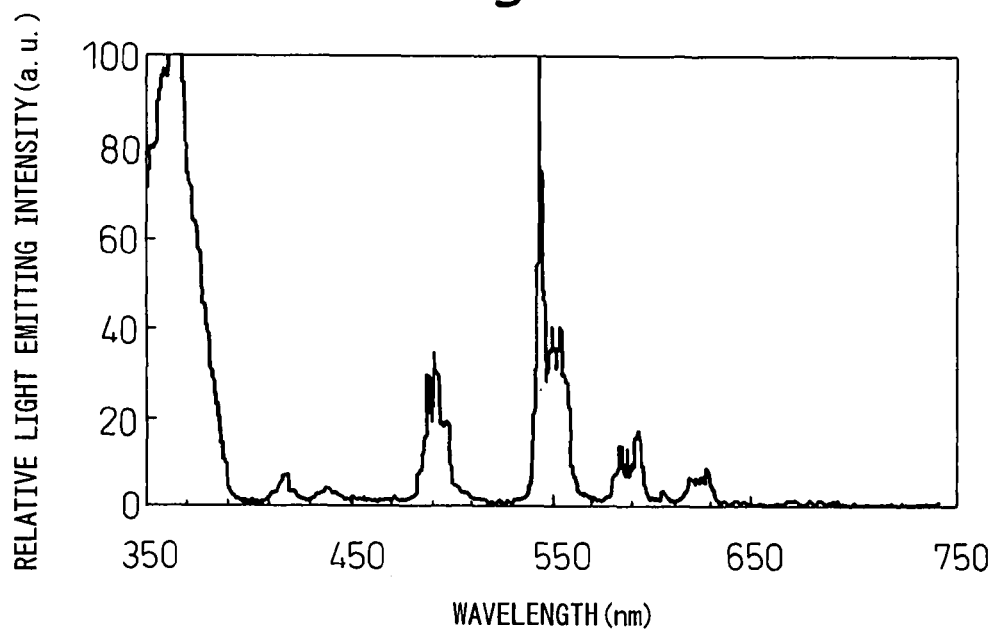
FIG. 5 is a view showing the spectrum of light obtained from the ceramic composite of Example 3.
Figure 6:
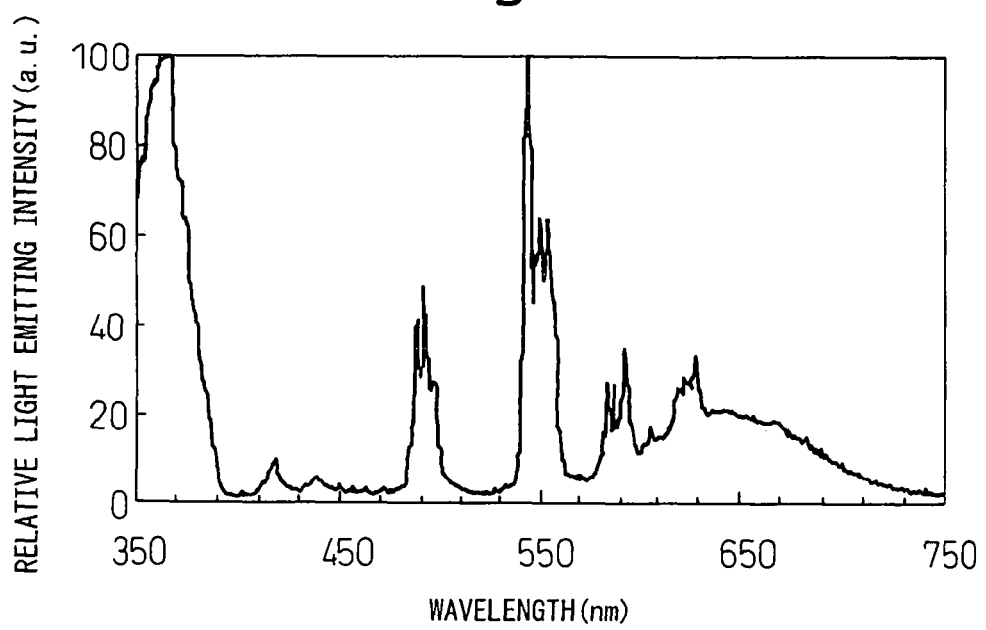
FIG. 6 is a view showing the light spectrum of the light-emitting diode obtained in Example 3.

A ceramic composite material for light conversion was produced by the same method as in Example 1 except for changing the additive from Ce to Tb, and a pellet having the same shape as in Example 2 was produced. FIG. 5 shows the light emission spectrum when this light conversion structure was excited by ultraviolet light (365 nm), and was confirmed that a green light was emitted upon receiving ultraviolet light. Subsequently, a film of the red fluorescent substance prepared in Example 1 was formed on one surface of this pellet by the same method as in Example 1. The spectrum of the light emitted from the surface coated with the red fluorescent substance was measured by irradiating ultraviolet light (365 nm) from the ceramic composite surface of this light conversion structure. FIG. 6 shows the light emission spectrum. At this time, the chromaticity coordinate was x=0.42 and y=0.39, revealing that a warm white light could be obtained. In this way, by using ultraviolet light and combining the light conversion material with the red fluorescent substance, a warm white light could be obtained while controlling the color tone of the ceramic composite material for light conversion.

INDUSTRIAL APPLICABILITY

A light-emitting device ensuring good light transmittance, high brightness and less deterioration and capable of controlling color tone is provided. Particularly, a solidified body comprising two metal oxide phases of $\alpha$-$Al_2O_3$ phase and cerium-activated $Y_3Al_5O_{12}$ (YAG) phase, and a light conversion structure comprising a fluorescent layer for the control of color tone, which emits a red light, are used, whereby a warm white light with high brightness and less deterioration can be obtained. Also, a solidified body comprising two metal oxide phases of $\alpha$-$Al_2O_3$ phase and cerium-activated $Y_3Al_5O_{12}$ (YAG) phase, and a light conversion structure comprising a fluorescent layer for the control of color tone, which emits a blue light, are used, whereby a white light with high brightness and less deterioration can be obtained. Furthermore, a solidified body comprising two metal oxide phases of $\alpha$-$Al_2O_3$ phase and terbium-activated $Y_3Al_5O_{12}$ (YAG) phase, and a light conversion structure comprising a fluorescent layer for the control of color tone, which emits a red light, are used, whereby a warm white light with high brightness and less deterioration can be obtained.

The invention claimed is:

1. A light emitting device comprising:
   a light emitting element for emitting a first light,
   a first layer of a ceramic composite which comprises a solidified body having formed therein an $\alpha$-$Al_2O_3$ phase and a Ce-activated $Y_3Al_5O_{12}$ (YAG:Ce) or Tb-activated $T_3Al_5O_{12}$ (YAG:Tb) phase continuously and three-dimensionally entangled with each other, in which said YAG:Ce or YAG:Tb phase emits a fluorescence and said $\alpha$-$Al_2O_3$ phase does not emit a fluorescence and transmits said first light, whereby said first layer absorbs a part of said first light to emit a second light and transmits a part of said first light, and
   a second layer of a ceramic composite formed on the surface of said first layer for controlling color tone, wherein said ceramic composite of said second layer comprises a solidified body having formed therein a Cr-doped $\alpha$-$Al_2O_3$ phase and a $Y_3Al_5O_{12}$ (YAG) phase continuously and three-dimensionally entangled with each other, whereby said second layer absorbs a part of said first light and/or a part of said second light, emits a third light and transmits a part of said first light and/or a part of said second light,
   wherein said light emitting device emits said first, second and third lights outward to obtain a desired white color tone light.

2. The light-emitting device as claimed in claim 1, wherein said light-emitting element is a light-emitting diode.

* * * * *